United States Patent [19]

Nossen

[11] 4,213,088
[45] Jul. 15, 1980

[54] VOLTAGE MEASURING CIRCUIT

[75] Inventor: Edward J. Nossen, Camden, N.J.

[73] Assignee: RCA Corporation, New York, N.Y.

[21] Appl. No.: 952,969

[22] Filed: Oct. 20, 1978

[51] Int. Cl.$^2$ .................. G01R 17/02; G01R 15/08
[52] U.S. Cl. ................................. 324/98; 324/115
[58] Field of Search ..................... 324/98, 115, 133

[56] References Cited

U.S. PATENT DOCUMENTS

| | | | |
|---|---|---|---|
| 3,714,569 | 1/1973 | Bruning, Jr. | 324/115 |
| 3,781,680 | 12/1973 | Stehlin et al. | 324/158 D |
| 3,810,014 | 5/1974 | Goldner | 324/123 R |
| 4,011,504 | 3/1977 | De Pillo | 324/115 |
| 4,024,471 | 5/1977 | Bakken | 324/123 R |

OTHER PUBLICATIONS

Elektor; Jul.-Aug., 1976; p. 758.
Electronics; Dec. 22, 1977; pp. 93-94.

Primary Examiner—Rudolph V. Rolinec
Assistant Examiner—Ernest F. Karlsen
Attorney, Agent, or Firm—William Squire; Samuel Cohen

[57] ABSTRACT

A voltage indicating meter is connected between the outputs of two high impedance operational amplifiers, the first of which receives an input signal to be measured through a range setting resistance dividing network and having a gain which can be set to one of a plurality of different values. A zero control network applies a bias voltage to the inverting input of the second operational amplifier for zeroing the meter. The non-inverting input of the second amplifier can be connected either to the output of the first operational amplifier or to a source of reference potential. When, during operation, the non-inverting input of this amplifier is connected to the source of reference potential, the one terminal of the meter is clamped to the bias level and the other receives a voltage proportional to the voltage of given polarity being measured and the meter needle swings in a given direction. When the non-inverting input of the second amplifier is connected to the output of the first operational amplifier, the meter still reads in the same direction for input voltage opposite in polarity to the given polarity.

15 Claims, 1 Drawing Figure

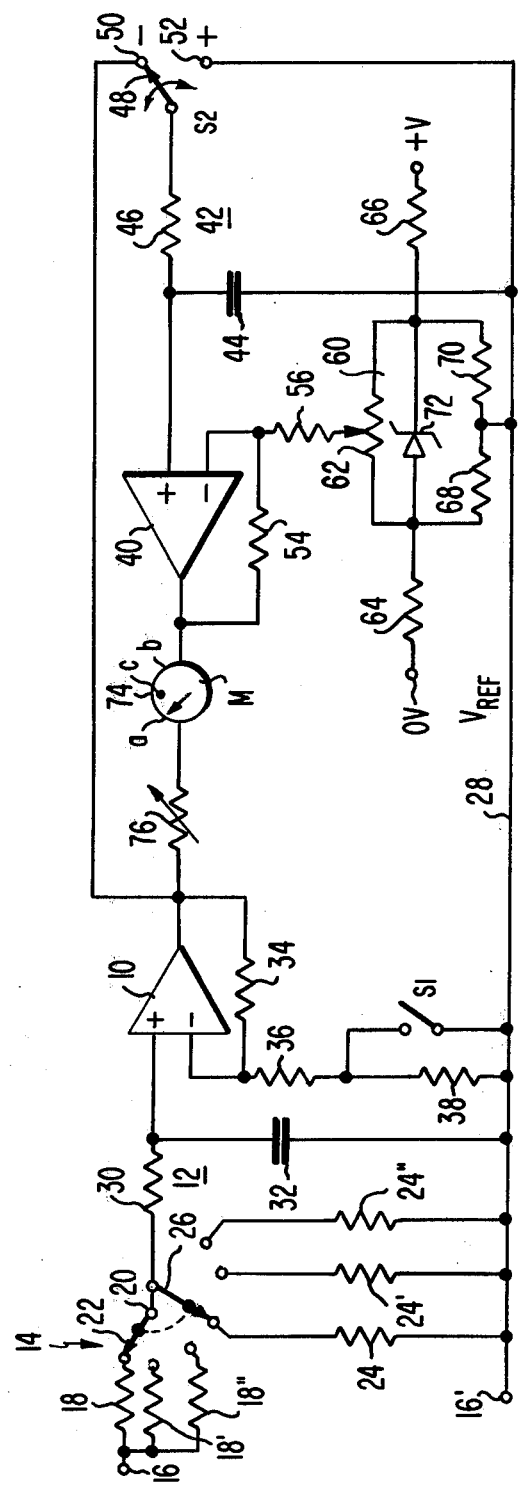

VOLTAGE MEASURING CIRCUIT

The present invention relates to apparatus for measuring direct current voltages.

High impedance voltmeters for measuring direct current voltages of one polarity may employ a bipolar or field effect transistor amplifier operated in a differential mode, and a sensitive microammeter which measures the difference in currents sensed by the amplifier. Voltages of opposite polarity may be measured by reversing the terminals of the meter movement. A zero control is provided to allow zero adjustment of the meter. Such meter adjustment usually drifts with change in scales since the impedance "seen" by the input stage is varied. Further, adjustment of the zero control setting increases the meter reading for one voltage polarity and decreases it for the opposite voltage polarity.

Other high input impedance voltage measuring apparatuses include operational amplifier circuits with a meter connected in a feedback arrangement across a diode bridge. Zero adjustment is made by applying a bias voltage to an input of the operational amplifier. A large number of input divider resistances are employed to provide a full range of input voltages to the circuits. Such divider resistances are usually precision resistances of relatively low tolerance and are relatively expensive. The resistances are switched by a corresponding large number of switching devices for making the desired scale changes which also adds to the complexity and cost of the apparatus.

A voltage measuring circuit embodying the present invention includes indicating means having a pair of inputs. During the calibration phase, a reference voltage is applied to one of the inputs and an adjustable bias to the other. To measure voltage of one polarity, a voltage proportional to the voltage being measured is added to the reference voltage at one input while the other input is held at the bias level. To measure voltage of the opposite polarity, a voltage proportional to this voltage is added to the reference voltage at the one input and a second voltage, at an amplified level proportional to the opposite polarity voltage, is added to the bias voltage at the other input.

The sole drawing figure is a schematic circuit diagram illustrating a preferred embodiment of the present invention.

In the drawing, an input voltage to be measured is applied between input terminals 16 and 16'. Network 14 includes a plurality of range selecting resistances 18, 18' and 18" which can be selectively connected between terminal 16 and terminal 20 by wiper 22 of switch S3. A second set of range selecting resistances 24, 24' and 24" are selectively connected between terminal 20 and common lead 28 via wiper 26 of switch S3. While a plurality of resistances 24, 24', and 24" are shown, a single resistance could be used instead. The wipers 22 and 26 are ganged, as shown by the dashed line, so that there is concurrent selection of a particular one of the range resistances 18, 18' and 18" and a corresponding one of resistances 24, 24' and 24". Terminal 16' is connected to common lead 28.

The terminal 20 is connected to the the non-inverting input of high-impedance, high-gain operational amplifier 10 through resistance 30 of filter 12. The capacitor 32 of filter 12 is connected between the non-inverting input of amplifier 10 and common lead 28. Lead 28 is at a reference level between 0 and +V volts as will be discussed later. The filter 12 has a long-time constant and its purpose is to filter switching transients produced by wipers 22 and 26. The values of resistances 18, 18' and 18" and 24, 24' and 24" are selected in accordance with the ranges of voltage it is desired that the circuit measure. In this particular example, there are three ranges determined by switch S3; however, by adding more resistors to each bank, the number of ranges would be increased.

The inverting input of amplifier 10 is connected to its output through feedback resistance 34 and to common lead 28 through series connected resistances 36 and 38. A switch S1 is connected across resistance 38. The values of resistances 34, 36 and 38 in the present example are such that the gain of amplifier 10 is two when switch S1 is open and six when switch S1 is closed. These gain values are given by way of example and in other implementations can have other values. Further, in some embodiments, switch S1 may be omitted. In the quiescent state, amplifier 10 draws negligible current. Thus the input and output $V_{10}$ of amplifier 10 are at $V_{ref}$ (the potential at common lead 28).

A second high-impedance, high-gain operational amplifier 40 has its non-inverting input connected to a switching transient filter 42 comprising capacitance 44 and resistance 46 which may have the same values as capacitance 32 and resistance 30, respectively. Filter 42 filters transients produced by the operation of switch S2. Wiper 48 of switch S2 is connected to the non-inverting input of amplifier 40 through resistance 46 of filter 42. Capacitance 44 is connected between the non-inverting input of amplifier 40 and common lead 28. Terminal 50 of switch S2 is connected to the output of amplifier 10 while terminal 52 is connected to common lead 28. The output of amplifier 10 is connected to one input of milliammeter 74 through variable resistance 76. The output of amplifier 40 is connected to the other input of milliammeter 74. Meter 74 has, for this example, a zero reading at a and a full scale reading at b and a center scale reading at c.

When switch S2 is connected to terminal 52, reference potential $V_{ref}$ of some given value produced by power supply 60 is applied via common lead 28 and resistance 46 to the non-inverting input of amplifier 40. $V_{ref}$ appears at the non-inverting input due to the high impedance of amplifier 40, that is, negligible current flows through amplifier 40 in the quiescent state of amplifier 40. When switch S2 is connected to terminal 50, the output voltage $V_{10}$ of amplifier 10 (at $V_{ref}$ in the quiescent state) is applied as an input to the non-inverting input of amplifier 40. Therefore the reference potential $V_{ref}$ applied to the non-inverting input of amplifier 40 does not change when wiper 48 is switched.

In response to wiper 48 connected to terminal 50, the output voltage $V_{40}$ of amplifier 40 follows the output voltage $V_{10}$ of amplifier 10 and has a value dependent on the gain of amplifier 40. The gain of amplifier 40 is determined by the feedback voltage divider resistances 54 and 56. Resistance 54 is connected between the output and inverting input of amplifier 40 and resistance 56 is connected between the inverting input of amplifier 40 and power supply 60. The values of resistances 54 and 56 are chosen in this example to make the gain of amplifier 40 two. Therefore, the value of any signal appearing at the output of amplifier 40 will be double the value of the signal appearing at the output of amplifier 10 when wiper 48 is connected to terminal 50 and of the same polarity as the output signal of amplifier 10. Since the gain of amplifier 10 with switch S1 open is made two and the gain of amplifier 40 is also made two, by way of example, then the value of resistance 34 in this case equals the value of resistance 54 and resistances 36 and 38 have a sum which equals the value of resistance 56.

Power supply 60 provides a bias voltage for the inverting terminal of amplifier 40 and a reference voltage for the common lead 28. The power supply 60 comprises a resistor 64, Zener diode 72 and resistor 66, connected in that order between a zero volt source and a positive voltage source +V. (In the alternative, the zero volt source may be replaced by a negative voltage source.) Tapped resistor 62 is connected across the Zener diode 72 as are the series connected resistors 68 and 70. Resistor 56 is connected at one end to the tap of resistor 62 and the common lead 28 connects to the circuit point between resistors 68 and 70 which may be of equal value.

In the operation of the power supply 60, Zener diode 72 conducts and places a constant voltage across resistor 62 and across the series connected resistors 68 and 70. A bias voltage thereby develops at the tap of resistor 62 and a reference voltage $V_{ref}$ at the common lead 28.

In operation of the system, assume that when there is zero volts across the meter, the needle is at a. With wiper 48 connected to terminal 52 the non-inverting input of amplifier 40 is at $V_{ref}$ with no voltage applied between input terminals 16 and 16', the output of amplifier 10 also is at $V_{ref}$. Now the tap at 62 is adjusted to provide a bias voltage at the inverting input of amplifier 40 and at the output of amplifier 40 which sets the pointer of meter 74 to the desired position, which in this example is a. To accomplish this, it is clear that the tap on 62 must be set to $V_{ref}$ as at this setting both terminals of the meter will be at $V_{ref}$ so no current flow through the meter. If it is desired to zero adjust the meter to a different setting, such as c, for example, then the tap on 62 is adjusted to a different setting such that current flows through the meter proportional to $V_{ref}-V_{62}$ (where $V_{62}$ is the voltage at the tap along resistor 62) which is sufficient to move the meter needle to position c. After this initial adjustment and before the voltage it is desired to measure is applied between terminals 16 and 16' the range scale for the circuit is set by setting the wipers 22 and 26 of switch S3.

The switch S1 is either closed or open in accordance with the desired range of voltages to be measured. As described above, for this example, with the switch S1 open, the gain of the amplifier 10 and its feedback network is made two, whereas with switch S1 closed the gain is made six. Therefore, by way of example, a 1.5 VDC input signal at terminal 20 will produce a 3 VDC at the output of amplifier 10 with the switch S1 open and a 0.5 VDC input signal at terminal 20 will produce a 3 VDC output signal at the output of amplifier 10 with switch S1 closed.

In the present description, it is assumed that the offset voltage of amplifier 40 is negligible. That is, this offset voltage has a value which may be in the order of millivolts as compared to a full scale measuring range of meter 74 in volts. Such low offset voltages would not be measured by meter 74 for this range.

In the quiescent condition of the circuit, that is, in the absence of an input voltage, when wiper 48 of switch S2 is connected to terminal 50, the reference potential $V_{ref}$ appears at the non-inverting input of amplifier 40, (as $V_{ref}$ is the output of amplifier 10). The same holds when wiper 48 of switch S2 is connected to terminal 52. The open or closed state of switch S1 does not affect the value of the reference potential applied to the inverting input of amplifier 10, in view of this amplifier's high impedance. Therefore the amplifier 10 output $V_{10}$ is not affected by any switching of switch S1 to alter the gain of amplifier 10, assuming as before, negligible offset voltage.

In summary, the following relationship exists between the outputs of amplifiers 10 and 40.

(1) $V_{10} - V_{40} = \pm V_{10} + V_{62}$ where $V_{10}$ and $V_{40}$ are the respective output voltages of amplifiers 10 and 40 and $V_{62}$ is the voltage at the tap of resistor 62 and the polarity of the $\pm V_{10}$ term is determined by the position of wiper 48 of switch S2 (terminal 50−, terminal 52+). It is apparent that polarity reversal occurs when switch S2 is switched from + to −, remembering, that the output $V_{40}$ is 2 $V_{10} - V_{62}$ in the S2 (=) position. In practice switch S2 is placed in the (=) position when $V_{10}$ is negative so that $V_{10}-V_{40}$ is positive. This results in the $V_{40}$ output being more negative that $V_{10}$ and meter 74 reading in the upscale (clockwise) direction from position a regardless the polarity of the input voltage to be measured.

Resistance 76 is a calibration resistor which is adjusted in accordance with the full scale current sensitivity of the meter 74. For example, with a full scale input range of 1.5 volts, the nominal voltage difference between amplifiers 10 and 40 is 3 volts. A meter with full scale sensitivity at one milliampere would require a total resistance of 3 k ohms.

When the voltage to be measured $V_{IN}$ applied between terminals 16 and 16' is positive, switch S2 wiper 48 is connected to terminal 52. This applies the constant reference potential $V_{ref}$ at common lead 28 to the non-inverting input of amplifier 40. With no voltage applied to terminals 16, −16', a relatively small offset error voltage may appear at the output of amplifier 10 due to its operating characteristics. Power supply 60 provides a bias signal voltage which can compensate for that offset error should it in certain low voltage instances be significant. That is, in those cases where full scale on meter 74 is a fraction of a volt, a millivolt offset may be significant with respect to that fraction.

In the absence of input voltage, no change in the meter 74 zero setting occurs when S2 is switched from one position to another. The values of resistances $62 \geq 70$ are made such that the down side (counterclockwise) zero adjustment on the meter (controlled by making $V_{62}$ more positive than $V_{ref}$), is about one third of the up scale (clockwise) zero adjustment on the meter (controlled by making $V_{62}$ less positive than $V_{ref}$). This is because it is desired, for purposes of convenience of operation, that the meter 74 initially be zeroed at a, for most input signals, and that it be deflected clockwise for voltages applied to terminal 16 of either polarity. A zero adjustment to c, the center of scale is used less often, it being of interest, for example, in certain alignment applications.

Once having set the zero adjustment of the meter 74 with the switch S2 wiper connected to terminal 52, a positive voltage applied to terminal 16 will cause the meter 74 to deflect in the clockwise direction. $V_{62}$ is present at one input to the meter; $V_{10}$, which is proportional to the input voltage is present at the other input to the meter, and the meter measures the difference between these voltages. If, for example, the meter is zeroed at a, when $V_{10}$ becomes more positive in response to a positive input signal ($V_{62}$ remaining constant) the meter needle deflects from a toward b. Closing switch S1 multiplies the gain of amplifier 10 by a given factor, three in this example (as determined by the relative values of resistances 36 and 38) and this increases the meter reading for a given input voltage. The change in gain produces a change in the offset error voltage of amplifier 10; however, this is generally negligible, as already mentioned. If it isn't, a new zero adjustment can be made at 62 with switch S1 closed, prior to measuring the voltage.

When a negative voltage is desired to be measured, switch S2 is switched to terminal 50 so that the reading on meter 74 is in the same direction as before. The output voltage $V_{10}$ of amplifier 10 is applied to the non-inverting input of amplifier 40 and the latter multiplies this voltage by a given factor, for example, two. Any negative voltage appearing at the output of amplifier 10 will also be negative at the output of amplifier 40, but at twice the magnitude (assuming a gain of two for the amplifier 40). This negative voltage $V_{40}$ will cause the meter 74 to read in a clockwise direction since $V_{40}$ is more negative than $V_{10}$. The following values are given by way of example for one implementation of the circuit

| Resistance 18 | 9 Meg Ω | for 15 volt scale |
|---|---|---|
| Resistance 24 | 1 Meg Ω | |
| Resistance 30 | 1 Meg Ω | |
| Capacitance 32 | 0.01 μF | |
| Resistance 34 | 1 Meg Ω | |
| Resistance 36 | 200 k Ω | |
| Resistance 38 | 800 k Ω | |
| Resistance 46 | 1 Meg Ω | |
| Capacitance 42 | 0.01 μF | |
| Resistance 54 | 1 Meg Ω | |
| Resistance 56 | 1 Meg Ω | |
| Resistance 62 | 5 k Ω | |
| Resistance 64 | 15 k Ω | |
| Resistance 66 | 10 k Ω | |
| Resistance 68 | 4.7 k Ω | |
| Resistance 70 | 15 k Ω | |

While a single power supply is illustrated herein having an exemplary range between 0 and 18 volts with the common lead floating, it is possible to employ alternative forms of power supplies. For example, one could use two fixed power supplies such as ones delivering +12 and −12 volts, respectively, and a common ground. The +12 volts may be employed as +V and the −12 volts may replace OV. Resistances 68 and 70 are not used, common lead 28 being connected to ground (zero volts).

If the power supply 60 comprises a regulated power supply, then the Zener diode 72 need not be employed. While one gain selection range is shown via switch S1 it is apparent that many resistances and corresponding switches in series with resistance 38 and switch S1, respectively, may be provided to provide other gain factors for amplifier 10. For example, a number of resistors could be placed in series with resistor 38 and a corresponding number of switches placed across the resistors, one switch for each resistor. The more different values of gain, the fewer resistors 18 and a correspondingly simpler switch would be required for network 14. For implementations where only input voltages within the voltage range of amplifier 10 are employed, network 14 may be aliminated completely and range selection may be provided by a number of gain selecting resistors and switches such as resistor 38 and switch S1. For high voltage inputs, network 14 provides attenuation to protect circuit 10 against overloads. Switch S1 may also be ganged with switch S3.

Once the zero bias adjust voltage is set for amplifier 40 by the tap at 62 it need not be readjusted when the ranges are switched by network 14. For a given gain of the amplifier 10 the bias voltage produced by power supply 60 at the tap of 62 remains constant. Only when certain voltages are switched by the gain switch S1 need the zero bias control be reset. For all other operations, a single adjustment is all that is required. There thus has been shown a simple circuit in which a meter of relatively low cost can be provided and which can be made to read in the same direction for either polarity of voltage to be measured.

For very low voltage implementations where the offset voltage of the amplifier 10 is a factor, a second adjustable voltage source may be employed. The connection between lead 28 and the point where switch S1 and resistor 36 join this lead may be opened and this point then connected to a tap on a resistor (not shown). This resistor may be connected in parallel with resistor 62. This second voltage source then can be used to zero the meter 74 so that switching S1 (or S2) will not affect the position of the needle of meter 74.

In operation, meter 74 is zeroed as before with wiper 48 connected to terminal 52. Switch S1 is open, wiper 48 is then connected to terminal 50. If the zero position of the meter is affected an amount sufficient to warrant re-zeroing the meter then the second tap to the second resistor is displaced to alter the bias supplied to amplifier 10 until the meter 74 is at the zero position.

At this time, switching S2 will result in no change in the meter reading. That is, the output $V_{10}$ is the same s the output $V_{40}$ (assuming a zero position at a on the meter) and both are now at $V_{ref}$. Since the offset voltage is no longer effectively present, a change in gain of amplifier 10 by switching S2 will also not result in any other offset voltage errors. At this time any of the switches may be operated without offset voltage errors.

What is claimed is:

1. A voltage measuring circuit comprising:
    voltage indicator means having first and second inputs for indicating the relative difference in potentials applied to said inputs,
    means for applying a reference voltage to one of said inputs during the quiescent state of said circuit,
    means for applying an adjustable bias voltage to the other of said inputs,
    means for applying a first voltage proportional to the voltage being measured to said one input,
    said means for applying said bias voltage including means for maintaining the voltage level at said other input at the level of said bias voltage for one polarity of said first voltage, and
    means for adding to said bias voltage a second voltage at an amplitude level proportional to said first voltage and of the same polarity as said first voltage for the opposite polarity of said first voltage.

2. The circuit of claim 1 wherein said means for applying a first voltage includes high impedance amplifier means connected to said one input having a given gain, and means for altering the value of said gain.

3. The circuit of claim 1 wherein said means for applying a reference voltage includes high-impedance, high-gain operational amplifier means having inverting and non-inverting inputs and an output, said output being connected to said one input, said amplifier means including resistive feedback means coupled between said output and said inverting input for setting the gain of said amplifier means, said feedback means including means for setting the gain of said amplifier means to a plurality of different values.

4. The circuit of claim 3 further including switch means having a common terminal which can be selectively connected to first and second terminals, feedback means for connecting said amplifier means output to one of said first and second switch terminals and means for applying said reference voltage to the other of said switch terminals, and second operational amplifier means connected to said other indicator means input terminal and said common terminal.

5. A voltage measuring circuit comprising:
first and second operational amplifiers each having an output, an inverting input and a non-inverting input,
a voltage indicating meter means connected between said outputs,
means for applying an input signal to be measured to the non-inverting input of one of said amplifiers,
first resistive feedback means connected to the output and inverting input of one of the amplifiers,
second resistive feedback means connected to the output and inverting input of the other of said amplifiers,
means for applying a bias potential to said other amplifier inverting input,
means for applying a first reference signal to the non-inverting input of one amplifier and a second reference signal to the non-inverting input of the other amplifier during the quiescent state of said circuit, and
switch means selectively connecting one of the output of said one amplifier and said means for applying said reference signals to said non-inverting input to said other amplifier.

6. The circuit of claim 5 wherein said second resistive feedback means has a value such that the gain of said other amplifier is greater than unity.

7. The circuit of claim 5 wherein said second feedback means includes means for setting the resistance thereof to a plurality of different values.

8. In a signal measuring circuit the combination comprising:
settable gain high input impedance amplifier means for receiving a signal to be measured as an input thereto exhibiting a first reference signal at its output during the quiescent state of said circuit,
fixed gain amplifier means having a gain greater than unity,
bias signal means connected to said fixed gain amplifier means for causing said fixed gain amplifier means to produce an indicator setting signal,
settable indicator means connected between the outputs of said fixed and settable gain amplifier means, and
means for selectively connecting one of (a) the output of said settable gain amplifier means and (b) a second reference potential as inputs to said fixed gain amplifier means.

9. In the circuit of claim 8 further including resistive range setting means adapted to receive a signal to be measured having a plurality of settable different resistance values connected to the input of said settable gain amplifier means.

10. A direct current voltage measuring circuit comprising:
first operational amplifier means having a first gain for producing an output reference voltage when in the quiescent state and adapted to receive an input signal to be measured for producing an output signal which is a measure of said input signal,
second operational amplifier means having a second gain greater than unity, said second amplifier means including first input means for producing a reference signal at the output of said second amplifier means at the same polarity as the output reference voltage of said first amplifier means during said quiescent state and second input means for producing a bias adjust signal at the output of said second amplifier means, and
voltage indicating means connected between said first and second amplifier means outputs and responsive to said adjust signal for indicating the difference in potentials between the outputs of said first and said second amplifier means.

11. The circuit of claim 10 further including means for setting the gain of said first amplifier means to any one of a plurality of different values.

12. The circuit of claim 10 wherein said first input means includes means for producing a fixed reference potential when the signal to be measured has one polarity, and means for producing a signal proportional to said signal to be measured when the signal to be measured has a second different polarity.

13. A voltage measuring circuit comprising:
voltage indicating means having first and second inputs for indicating the relative difference in potentials applied to said inputs,
means for applying a reference potential to said first input during the quiescent state of said circuit,
means for applying a potential proportional to the voltage to be measured to said first input of said voltage indicating means,
operational amplifier means having inverting and non-inverting inputs and an output, said output being connected to said second input of said voltage indicating means,
adjustable bias voltage means connected to said output and inverting input of said operational amplifier means for applying a bias potential to said second input of said voltage indicating means, and
means for selectively connecting said non-inverting input of said operational amplifier means to one of (a) said first input of said voltage indicating means and (b) a source of reference potential.

14. The circuit of claim 13 wherein said operational amplifier means includes resistive feedback means connected to its output and inverting input, said feedback means having a resistive value for setting the gain of said amplifier means at a level greater than unity.

15. The circuit of claim 13 wherein said means for adding a potential includes resistive dividing means connected to said first input and terminal means for receiving a voltage to be measured.

* * * * *